US008204446B2

(12) United States Patent
Scheer et al.

(10) Patent No.: US 8,204,446 B2
(45) Date of Patent: Jun. 19, 2012

(54) ADAPTIVE ANTENNA TUNING SYSTEMS AND METHODS

(75) Inventors: Roger Scheer, Beach Park, IL (US);
Eric Krenz, Crystal Lake, IL (US);
Istvan Szini, Grayslake, IL (US)

(73) Assignee: Motorola Mobility, Inc., Libertyville, IL (US)

( * ) Notice: Subject to any disclaimer, the term of this patent is extended or adjusted under 35 U.S.C. 154(b) by 419 days.

(21) Appl. No.: 12/608,604

(22) Filed: Oct. 29, 2009

(65) Prior Publication Data

US 2011/0105023 A1    May 5, 2011

(51) Int. Cl.
*H04B 17/00* (2006.01)
(52) U.S. Cl. .................... 455/67.11; 455/129; 455/193.1
(58) Field of Classification Search .............. 455/3.01, 455/3.03, 62, 63.1, 67.11, 115.1, 121, 129, 455/193.1
See application file for complete search history.

(56) References Cited

U.S. PATENT DOCUMENTS

| 4,201,960 | A | 5/1980 | Skutta et al. |
| 6,657,595 | B1 | 12/2003 | Phillips et al. |
| 7,167,135 | B2 | 1/2007 | Kipnis et al. |
| 7,199,762 | B2 | 4/2007 | Liu et al. |
| 7,633,909 | B1 * | 12/2009 | Jones et al. ................... 370/338 |
| 2007/0042710 | A1 * | 2/2007 | Mahini et al. ................ 455/3.03 |
| 2007/0232367 | A1 | 10/2007 | Kasha et al. |
| 2011/0237196 | A1 * | 9/2011 | Niu et al. ........................ 455/62 |

FOREIGN PATENT DOCUMENTS

EP    0047354 A1    3/1982

* cited by examiner

*Primary Examiner* — Thanh Le

(57) ABSTRACT

Embodiments include antenna tuning systems and methods of tuning an antenna of a wireless device with an antenna, a circuit with at least one tunable component, and a processing system. The processing system determines tuning selection inputs during a communication session. Based on the tuning selection inputs, the processing system determines one or more component values for one or more tunable components. In an embodiment, the component value(s) are determined from a set of pre-defined component values. The tunable component(s) are controlled to have the determined component value(s). The circuit may be an impedance matching circuit that includes at least one tunable reactive component. Alternatively, the circuit may be an antenna tuning circuit that includes at least one variable component. In an embodiment, both an impedance matching circuit and an antenna tuning circuit may be implemented, with each type of circuit having one or more tunable components.

23 Claims, 5 Drawing Sheets

| | Entry No. 421 | Call Type 422 | Chan 423 | Spkr Ph 424 | BT 425 | Grip 426 | Prox 427 | SNR 428 | Component Value C1, C2, C3 (pF) 429 |
|---|---|---|---|---|---|---|---|---|---|
| 401 | 1 | V | 1 | 1 | 0 | 0 | 0 | L | 4.2, 6.1, 4.8 |
| 402 | 2 | V | 1 | 0 | 0 | 5 | 10 | H | 5.1, 5.3, 2.4 |
| 403 | 3 | V | 2 | 1 | 0 | 0 | 0 | L | 4.7, 5.4, 3.3 |
| 404 | 4 | V | 2 | 0 | 0 | 5 | 10 | H | 5.3, 5.3, 3.6 |
| | ... | | | | | | | | |
| 405 | 51 | D | 1 | 0 | 0 | 2 | 0 | L | 5.5, 4.4, 6.6 |
| 406 | 52 | D | 1 | 0 | 1 | 2 | 0 | L | 7.4, 3.7, 4.1 |
| 407 | 53 | D | 2 | 0 | 0 | 2 | 0 | L | 6.2, 5.1, 5.6 |
| 408 | 54 | D | 2 | 0 | 1 | 2 | 0 | L | 6.3, 7.0, 5.9 |
| | ... | | | | | | | | |
| 409 | 91 | V | 18 | 0 | 0 | 9 | 9 | L | 9.0, 4.7, 5.7 |
| 410 | 92 | V | 18 | 0 | 0 | 9 | 10 | H | 6.4, 5.1, 2.0 |
| 411 | 93 | V | 18 | 1 | 0 | 10 | 9 | L | 8.6, 7.2, 6.6 |
| 412 | 94 | V | 18 | 1 | 0 | 10 | 10 | H | 6.6, 3.0, 4.2 |
| | ... | | | | | | | | |

FIG. 4

| | USER ID 511 | CALL TYPE 512 | SELECTION HISTORY 513 | TIME IN TUNING STATE 514 |
|---|---|---|---|---|
| 501 | 0001 | V | 15<br>17<br>37<br>34 | 1:15:27<br>0:47:15<br>0:10:55<br>0:02:32 |
| 502 | 0001 | D | 21<br>24 | 0:07:13<br>0:02:33 |
| 503 | 0002 | V | 3<br>31 | 0:22:21<br>0:12:18 |
| 504 | 0027 | D | 44<br>40<br>97 | 2:38:04<br>1:03:55<br>0:21:19 |

ADAPTIVE ANTENNA TUNING SYSTEMS AND METHODS

TECHNICAL FIELD

The inventive subject matter relates generally to wireless communications, and more particularly to antenna tuning in a wireless communication device.

BACKGROUND

Due primarily to consumer preferences, the physical sizes of wireless handheld communication devices continue to shrink while the number of features provided continues to increase. In addition, various wireless devices are now designed to support communications within multiple frequency bands. Each of these developments has impacted the design and performance of antenna systems within contemporary wireless devices.

As is well known, an antenna system of a wireless device provides a means by which radio frequency (RF) power may be radiated into or detected from the environment. Although previous generations of wireless devices commonly included externally protruding antennas, the antennas of many current wireless devices are completely enclosed within a device's housing. Accordingly, an antenna occupies some portion of the physical volume within the device's housing. The continuing drive toward smaller devices places ever-increasing constraints on the amount of space that may be allotted for antenna volumes. In addition, some wireless devices that are designed to support communications within multiple frequency bands include multiple antennas (e.g., one antenna for each supported frequency band), thus increasing the space required for the antenna system, despite the drive toward smaller device sizes. Other wireless devices are designed to support communications using multiple communications protocols on separate frequency bands, again warranting the inclusion of multiple antennas in a single wireless device.

Along with issues relating to antenna volumes, the characteristics of housing-enclosed antenna systems also raise issues relating to performance. More particularly, the performance of an enclosed antenna may be significantly affected by the manner in which a device user holds the wireless device during operation. For example, the compact designs of some wireless devices enable a user to enclose significant portions of the device's housing in the user's hand. In addition, a user may be inclined to press the front surface of the device's housing against the user's face, and accordingly a significant portion of the front surface may be in contact with the user during device operation. The degree of contact between a wireless device and a user's body (e.g., the user's hand and face) may significantly and detrimentally affect the radiation efficiency of the device's antenna (e.g., by perturbing an antenna element's resonant frequency).

More recently, the inclusion of impedance matching circuits in wireless devices has facilitated the development of relatively compact, enclosed antenna systems that may provide reliable communications over multiple frequency bands. Essentially, an impedance matching circuit may be tuned to provide an impedance match for the antenna at a desired operating frequency. Adaptive tuning of the impedance matching circuit in conventional devices is driven by feedback data received from the RF system (e.g., information pertaining to the transmit path and the receive path) and/or information regarding the physical environment around the wireless device. Unfortunately, current systems adapted to provide complete, accurate, and dependable information about the receive path and the physical environment around the wireless device tend to be costly, complex, and difficult to implement.

Accordingly, what are needed are methods and apparatus for tuning an impedance matching circuit, which may be relatively inexpensive, simple, and easy to implement, when compared with conventional methods and apparatus. Other desirable features and characteristics of the present inventive subject matter will become apparent from the subsequent detailed description and the appended claims, taken in conjunction with the accompanying drawings and this background.

BRIEF DESCRIPTION OF THE DRAWINGS

FIG. 4 illustrates an example of a component value lookup table, in accordance with an example embodiment; and FIG. 5 illustrates an example of a historic selection table, in accordance with an example embodiment.

DETAILED DESCRIPTION

The following detailed description is merely exemplary in nature and is not intended to limit the inventive subject matter or the application and uses of the inventive subject matter. Furthermore, there is no intention to be bound by any theory presented in the preceding background or the following detailed description.

Embodiments described herein include adaptive antenna tuning systems and methods. As will be described in detail below, a wireless communication device includes the antenna and one or more circuits, which may be controlled to affect the antenna tuning (e.g., matching circuit 106 and/or tuning circuit 107, FIG. 1). An embodiment of a method for adaptively tuning the antenna includes determining one or more tuning selection inputs in conjunction with a wireless communication session that is supported by the wireless communication device. The method also includes determining, based on the tuning selection inputs, values for one or more components of the antenna tuning and/or matching circuits. According to an embodiment, the component values are determined from a set of pre-defined component values (e.g., within a lookup table). The components are adjusted to have the determined component values.

Figure 1:
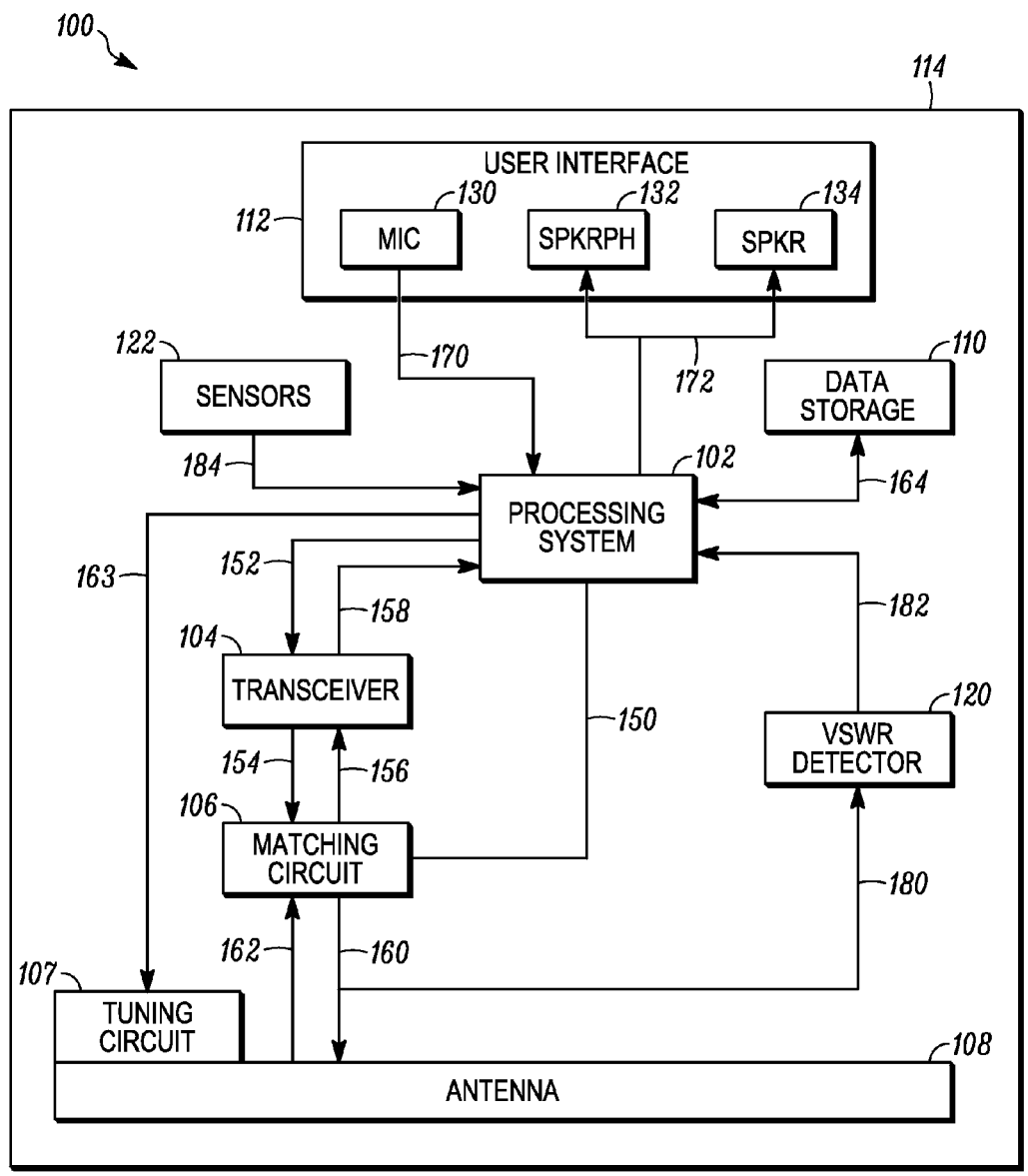
FIG. 1 illustrates a simplified diagram of a wireless communication device within which an adaptive antenna tuning system is incorporated, in accordance with an example embodiment.

FIG. 1 illustrates a simplified diagram of a wireless communication device 100 within which an adaptive antenna system is incorporated, in accordance with an example embodiment. Device 100 may be a cellular telephone, according to an embodiment, although device 100 may be some other type of wireless communication apparatus, in other embodiments (e.g., a one-way or two-way radio, a computer, a personal data assistant (PDA), a pager, a wireless personal area network (WPAN) compatible device, or some other type of wireless communication apparatus). According to an embodiment, device 100 includes a processing system 102, a transceiver 104, at least one matching circuit 106, at least one antenna 108, data storage 110, a user interface 112, and a housing 114. According to further embodiments, device 100 also may include a voltage standing wave ratio (VSWR) detector 120 and/or one or more proximity or other types of sensors 122.

Processing system 102 may include, for example, one or more general-purpose or special-purpose microprocessors, application specific integrated circuits (ASICs), digital-to-analog converters (DACs), analog-to-digital converters (ADCs), reference generators, clocks, and/or associated circuitry. According to an embodiment, processing system 102 is adapted, during operation, to control the functionality of matching circuit 106 and/or tuning circuit 107 by selecting one or more component values for one or more components of matching circuit 106 and/or tuning circuit 107. Once selected, processing system 102 provides control signals 150 to matching circuit 106 and/or tuning circuit 107, which cause matching circuit 106 and/or tuning circuit 107 to set the associated components to the indicated component values (e.g., to "tune" antenna 108). As will be described in more detail below, selection of the component values is performed based on one or more "tuning selection inputs" that are received or determined by processing system 102. In addition, the component values may be selected from a set of pre-defined component values, which may be stored within data storage 110, for example.

Matching circuit 106 may include, for example but not by way of limitation, a matching network, a balun, an antenna tuner, a transmatch or an antenna tuning unit (ATU). Matching circuit 106 is coupled with antenna 108, and is adapted, during operation, to provide an input impedance to antenna 108, where the input impedance may be varied by adjusting the values of one or more passive or active impedance matching components (not illustrated in FIG. 1) of matching circuit 106. More particularly, matching circuit 106 includes at least one reactive component (e.g., capacitors, inductors, or other components), which has a value that may be varied under the command or control of processing system 102 (via control signals 150). According to an embodiment, the impedance matching component values are selected (e.g., by processing system 102) so that the input impedance of matching circuit 106 closely matches the load impedance of antenna 108, in order to maximize the power transfer and minimize reflections from antenna 108. The impedance matching components of matching circuit 106 may include, for example, one or more reactive components (e.g., capacitors, inductors), transformers, switchable elements (e.g., transistors), and/or resistive components (e.g., resistors). An example of a matching circuit 106 will be discussed later in conjunction with FIG. 3.

Tuning circuit 107 may include, for example but not by way of limitation, a tunable circuit and a parasitic tuning element and/or an active tuning element (e.g., a switching ground connection). Tuning circuit 107 is coupled with antenna 108, and is adapted, during operation, to drive the parasitic and/or active tuning element, thus affecting the frequency characteristics of antenna 108. One or more of the tuning circuit component values may be varied, according to an embodiment. More particularly, tuning circuit 107 includes at least one variable component (e.g., capacitors, inductors, or other components), which has a value that may be varied under the command or control of processing system 102 (via control signals 163).

Transceiver 104 is coupled between processing system 102 and matching circuit 106, and includes a transmitter and a receiver. In accordance with providing a transmit function, transceiver 104 receives baseband digital signals 152 from processing system 102, and the transmitter portion of transceiver 104 filters and processes the digital signals, converts the resulting digital signals to analog signals, and amplifies and upconverts the analog signals to produce a radio frequency (RF) analog signal 154 intended for transmission. In accordance with providing a receive function, transceiver 104 receives RF analog signals 156, amplifies and downconverts the analog signals, converts the resulting analog signals to digital signals, and processes the digital signals to produce a baseband digital signal 158 that is ready for further processing by processing system 102.

Antenna 108 is coupled with matching circuit 106 and tuning circuit 107, and may include, for example, a single antenna element or a plurality of antenna elements. Upon receipt of an analog signal 160 from matching circuit 106, antenna 108 is adapted to radiate RF power corresponding to the analog signal into the environment. In addition, antenna 108 is adapted to detect RF power from the environment, and to provide corresponding analog signals 162 to matching circuit 106. The frequency characteristics of antenna 108 may be affected by tuning circuit 107, as mentioned previously. According to an embodiment, antenna 108 is completely contained within housing 114, although antenna 108 may partially or completely extend outward from housing 114, or antenna 108 may be embedded in or be formed from part of housing 114, in other embodiments. The housing 114 and/or internal printed circuit boards (not illustrated) may act as ground planes for antenna 108. Although only a single antenna 108, transceiver 104, matching circuit 106, and tuning circuit 107 are shown in FIG. 1, it is to be understood that multiple instantiations of these components may be included in a device, in order to implement antenna diversity (e.g., multiple-in, multiple-out (MIMO) antenna arrays), communications within different frequency bands, and/or communications using different communications protocols.

Data storage 110 may include, for example, one or more data storage devices that are separate from or integral with processing system 102. Data 164 may be stored by processing system 102 within data storage 110, or retrieved by processing system 102 from data storage 110. For example, data storage 110 may include a combination of various types of non-volatile and volatile read only memory (ROM) and random access memory (RAM). According to an embodiment, data storage 110 is adapted to store pre-defined component values for at least those components of matching circuit 106 and/or tuning circuit 107 that are variable. As will be described in more detail later, the pre-defined component values may be stored in the form of a lookup table, where each entry of the table may include values for one or more impedance matching components. An entry is selected by processing system 102 based on one or more tuning selection inputs, according to an embodiment. Accordingly, for example, the lookup table may be implemented in the form of a relational table, where the tuning selection inputs are used to select entries within the table that have certain attributes (e.g., attributes corresponding to the tuning selection inputs). According to an embodiment, data storage 110 also may be adapted to store information that enables a correlation between a user identity and historically selected component values, as will also be described in more detail later.

User interface 112 may include a plurality of devices that enable a user and device 100 to interact. For example, user interface 112 may include a microphone (MIC) 130, a speakerphone (SPKRPH) 132, a speaker (SPKR) 134, a keypad, a display, a touchscreen, and any of a number of other types of user interface devices. A detailed description of the functionality of various user interface devices is out of the scope of this description, however, certain embodiments may employ information pertaining to the MIC 130, SPKRPH 132, and/or SPKR 134, and therefore the functionality of these system elements will be briefly described. MIC 130 is adapted, during operation, to convert environmental vibrations (particularly associated with speech) into an analog audio signal 170, and to provide the analog audio signal 170 to processing system 102. As will be described in more detail later, processing system 102 may evaluate the analog audio signal 170 to determine a signal-to-noise ratio (SNR), and the SNR may indicate one type of tuning selection input, according to an embodiment. SPKRPH 132 is adapted, during operation, to receive analog audio signals 172 from processing system 102, to amplify the analog audio signal 172 to a relatively high level associated with a speakerphone, and to produce sound from the amplified analog signal. Similarly, SPKR 134 is adapted, during operation, to receive analog audio signals 172 from processing system 102, to amplify the analog audio signal 172 to a relatively low level associated with a speaker that is proximate to an ear, and to produce sound from the amplified analog signal. Typically, only one of SPKRPH 132 or SPKR 134 is active at any given time, and the activation is performed based on user inputs. According to an embodiment, the activation states of SPKRPH 132 and/or SPKR 134 is known by or accessible to processing system 102, and the activation state may indicate another type of tuning selection input. Detection of whether SPKRPH 132 or SPKR 134 is active is an indication of a user mode in which device 100 is being used.

VSWR detector 120 is coupled between the output of matching circuit 106 and the input to antenna 108. VSWR detector 120 is adapted, during operation, to monitor actual forward and reflected RF power 180 in order to calculate a VSWR measurement 182, that VSWR detector 120 may provide to processing system 102. VSWR measurements 182 may be expressed using S-parameters (scattering parameters), for example. According to an embodiment, VSWR detector 120 includes a 4-port directional coupler, with a main line input and output ports being connected to the output of matching circuit 106 and the input to antenna 108, respectively. Both coupled ports of the coupler are connected to corresponding RF power sensors, which provide data about measured forward and reflected RF power levels. As will be described in more detail later, VSWR measurements 182 may indicate yet another type of tuning selection input, and may also or alternatively be used to determine whether tuning of matching circuit 106 and/or tuning circuit 107 is optimized.

Sensors 122 may be disposed within or on housing 114 at various locations. According to an embodiment, at least some of sensors 122 are adapted, during operation, to detect the proximity of the device to external objects, such as parts of a user's body or other objects, for example. Sensors 122 may include, for example but not by way of limitation, one or more capacitive sensors, infrared (IR) proximity sensors, pressure sensors, or other types of sensors. A capacitive sensor may be activated when a nominally conductive material (e.g., a user's hand or cheek) contacts or is sufficiently close to the sensor. An IR proximity sensor may be activated when it is in proximity with any material that scatters IR energy. One or more sensors 122 may be positioned, for example, on the front, back, and/or sides of the phone housing. According to another embodiment, sensors 122 may include one or more accelerometers, which may enable a determination of whether the wireless device 100 is being used in a portrait or landscape mode, for example. According to an embodiment, sensors 122 provide signals 184 to processing system 102, which may indicate yet another type of tuning selection input.

As mentioned previously, processing system 102 may receive and/or determine a variety of tuning selection inputs, and based on the tuning selection inputs, processing system 102 may determine component values for one or more impedance matching components of matching circuit 160. For example, as mentioned previously, processing system 102 may access a lookup table (e.g., a table stored in data storage 110), and may select, based on the tuning selection inputs, an entry of the lookup table that includes various, pre-defined component values. Processing system 102 may then "tune" the matching circuit 160 by providing control signals 150, which result in the values of the impedance matching components being set to the selected values. According to various embodiments, the tuning selection inputs may include any one or more types of information selected from a group of information types that includes:

- a call type indicating whether the wireless communication session is a voice communication session or a data communication session,
- a description of a channel assigned for the communication session,
- a speakerphone activation indicator,
- a speaker activation indicator,
- a Bluetooth activation indicator,
- a user identity,
- information characterizing a grip with which a user is holding the wireless communication device,
- information characterizing a physical proximity of the wireless communication device to the body of the user,
- a sensor input,
- a VSWR measurement, and
- an SNR measurement.

Characteristics of the physical and communications environments within which antenna 108 operates (e.g., characteristics of the user's grip, the proximity of wireless device 100 to the user's face, a communication frequency, and so on) may significantly affect the impedance of antenna 108. For example, when a communication device is tightly gripped (e.g., cradled) and held against the face, the impedance of antenna 108 may be significantly lower than when the communication device is used in a hands-free mode (e.g., placed on a desk during operation). In addition, the impedance of antenna 108 may be predictably higher when communicating at a certain frequency (or within a certain frequency band) than it is when communicating at a different frequency (or within a different frequency band). According to various embodiments, the above-listed tuning selection inputs may be used to directly sense and/or predict characteristics of the physical and/or communications environments, and those characteristics of the physical and/or communications environments may be used in the process of selecting impedance matching component values, as will be described in more detail in conjunction with FIGS. 2-5.

Figure 2:
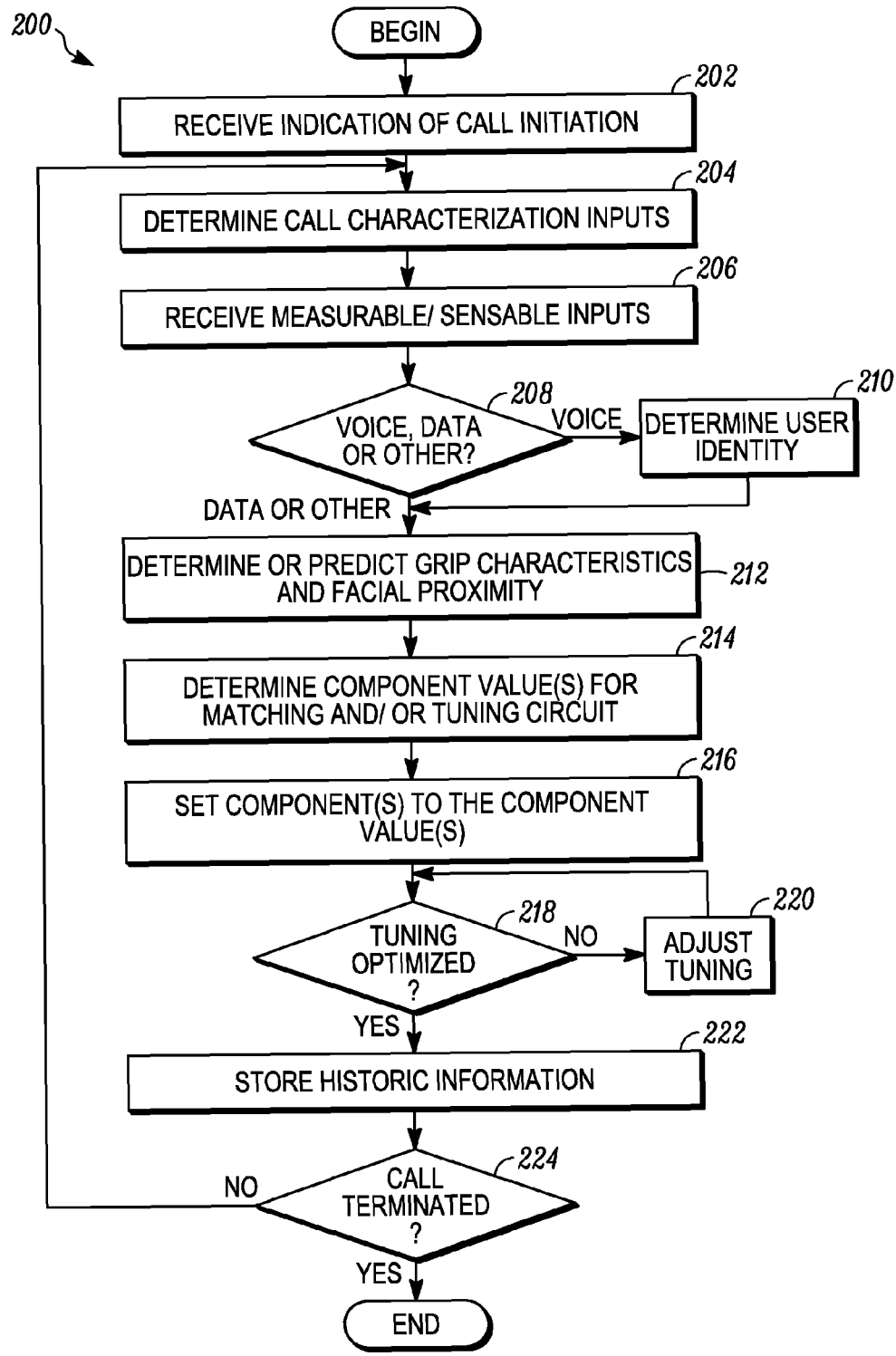
FIG. 2 illustrates a flowchart of a method for selecting and setting impedance matching component values for components of an impedance matching circuit, in accordance with an example embodiment.

FIG. 2 illustrates a flowchart of a method for selecting and setting impedance matching component values of an impedance matching circuit, in accordance with an example embodiment. According to an embodiment, the method may be performed within the context of a "call," where a "call" refers to any type of communication session in which a wireless device transmits RF signals (e.g., a voice communication session or a data communication session). The method may run continuously for a duration of the call, or may be executed periodically, aperiodically or in response to a triggering event (e.g., a handoff, a change in a value of a tuning selection input, or some other event).

Embodiments of the method may be performed by a processing system (e.g., processing system 102, FIG. 1) in conjunction with a matching circuit (e.g., matching circuit 106), a tuning circuit (e.g., tuning circuit 107), and various other system elements that may provide tuning selection inputs and/or that may enable tuning selection inputs to be determined or predicted. According to an embodiment, the method may begin, in block 202, when the processing system receives an indication that a call has been initiated or is in progress. This may include, for example, receiving an indication that a user has pressed a "SEND" button or receiving an input from a system component (e.g., transceiver 104 or user interface 112, FIG. 1) that indicates that a call is being initiated, established or is otherwise in progress.

In block 204, the processing system may determine one or more of a first type of tuning selection input, which are referred to herein as "call characterization inputs." A call characterization input may include, for example, information relating to an established setting for the communication session or describing the use mode of the wireless device. For example, but not by way of limitation, call characterization inputs may include an indication of a call type (e.g., whether the call is a voice communication session, a data communication session, or another type of communication session, such as a WiFi, WiMax, video, or other type of session), a channel or band allocated for the call (e.g., a frequency or frequency band), a speakerphone activation indictor (e.g., indicating whether the speakerphone is in an activated or deactivated state), a speaker activation indictor (e.g., indicating whether the speaker is in an activated or deactivated state), and a Bluetooth activation indicator (e.g., indicating whether or not the wireless device is currently configured to communicate using a Bluetooth protocol), among other things. As will be described in more detail later, any one or more of these tuning selection inputs may be used directly during the process of selecting component values (i.e., block 214 discussed below). Alternatively, they may be used to predict the characteristics of a user's grip and/or the proximity of the wireless device to the user's face (or other body part) (i.e., block 212 also discussed below), and the grip and/or facial proximity predictions may be used during the component value selection process (i.e., block 214).

In block 206, the processing system may receive one or more of a second type of tuning selection input, which are referred to herein as "measurable/sensable inputs." A measurable/sensable input may include, for example, information received from a proximity sensor (e.g., one or more of sensors 122, FIG. 1), VSWR measurements (e.g., from VSWR detector 120, FIG. 1), and audio data (e.g., from MIC 130, FIG. 1) that enables calculation of an SNR or other metric.

According to an embodiment, the processing system also may use knowledge of or a prediction of a user's identity (user ID) during the process of selecting component values. This information may be relevant, for example, because each user may tend to grip a wireless device and hold it to the user's head in a consistent manner (although in a manner that may be different from other users). According to an embodiment, the processing system maintains historical data for each known user, where the historical data may include a description of characteristics of the user's typical grip and head proximity, and/or a listing of one or more previously selected component values (e.g., entry numbers within a lookup table of component values).

A user ID may not be relevant in the selection of component values during a data communication session. Therefore, according to an embodiment, the system may make a determination, in block 208, whether a voice communication session, a data communication session, or another type of communication session is being conducted. When a voice communication session is being conducted, then the system may attempt to identify the user, in block 210. According to an embodiment, the system may attempt to identify a user by receiving speech data, if it is available (e.g., from MIC 130, FIG. 1), and executing speaker recognition software to attempt to identify the user from the received speech data. According to another embodiment, the user may provide a user input to indicate that the user is communicating using the wireless device (e.g., a user input via the keypad). The user ID may be considered to be a third type of tuning selection input.

In block 212, various ones of the previously received or determined tuning selection inputs may be used to determine or predict characteristics of the grip with which the wireless device is being held, and/or to determine or predict the proximity of the user's face to the wireless device. According to an embodiment, the grip characteristics may include a grip tightness factor and a housing coverage factor, each of which may be qualified or quantified by a finite number of indicators. For example, a grip tightness factor may be quantified by a number within a range (e.g., from 1 to 10), where the low end of the range corresponds to an extremely light grip, and the high end of the range corresponds to an extremely tight grip, or vice versa. Alternatively, a grip tightness factor may be qualified by a descriptor of the grip tightness, such as "light", "medium," or "tight." Similarly, a housing coverage factor may be quantified by a number indicating a percentage of the housing that is enclosed by the user's hand (or hand and face), or the housing coverage factor may be qualified by a descriptor of the location of coverage or the amount of coverage, such as "minimal," "partial," "full," "minimal back surface," "partial back surface," "full back surface," "minimal front surface," "partial front surface," or "full front surface." Facial proximity also may be quantified or qualified, according to an embodiment. For example, a facial proximity indicator may indicate whether the wireless device is in actual contact with the face or in close proximity to the face. When the wireless device is predicted or determined to be in actual contact with the face, the facial proximity indicator may indicate the amount of coverage. Because the face is more likely to be contacting the front surface of the wireless device, the facial proximity indicator may be qualified by descriptors such as "minimal," "partial," and "full," for example. The above types of quantifiers and qualifiers are given for example purposes only, and not by way of limitation.

As mentioned above, grip characteristics and/or facial proximity may be determined or predicted. According to an embodiment, grip characteristics and facial proximity may be "determined" using tuning selection inputs such as proximity sensor inputs (e.g., as received in block 206). For example, sensor inputs may indicate whether or not a sensor on the wireless device is being touched, how hard it is being touched, and/or whether an object (e.g., a cheek) is in close proximity to the sensor. Further, inputs from capacitive sensors (as opposed to IR sensors) may indicate whether or not the object that is touching the sensor is nominally conductive (e.g., a part of the user's body), thus enabling a determination of whether the object is animate or inanimate. Further, because the locations of the various sensors may be known in relation to the housing, the locations of activated sensors (and/or the number of activated sensors) may indicate how much of the housing is encompassed by the user's hand or cheek. These sensor inputs may enable grip tightness, housing coverage, and facial proximity to be quantified or qualified.

In contrast, grip characteristics and facial proximity may be "predicted" using other tuning selection inputs, such as the user ID (if known), the call type, the speakerphone or speaker activation status, and/or the Bluetooth activation status. For example, during a data communication session, when the speakerphone is activated (or the speaker is deactivated), or when Bluetooth is activated, a user typically does not hold the wireless device to the user's face. Accordingly, a prediction may be made that the wireless device is not in proximity to the face. In addition, a prediction may be made that the grip characteristics include a loose or medium grip. In contrast, during a voice communication session and when the speakerphone is deactivated (or the speaker is activated), the user is more likely to be holding the wireless device to the user's face. Accordingly, a prediction may be made that the wireless device is in proximity to (or contacting) the user's face, and/or that the grip characteristics include at least a medium grip. According to yet another embodiment, the processing system may calculate an SNR from received audio data (e.g., received in block 206). For SNR measurements that exceed a threshold (e.g., indicating a relatively noisy environment), the processing system may predict that the wireless device is being held tightly and/or very near to or against the user's face (e.g., the wireless device is being rubbed against the user's cheek). Conversely, for SNR measurements that fall below the threshold (e.g., indicating a relatively quiet environment), the processing system may predict that the wireless device is being held more loosely, and/or is not being held very near to or against the user's face.

According to an embodiment, the user ID (if known) may be used to predict grip characteristics and/or facial proximity based on previously-stored, historical information. For example, the first time that the processing system has identified a new user (e.g., based on an evaluation of a previously unrecognized voice), the processing system may assign a unique user ID to the user. During that first communication session, and for subsequent communication sessions conducted by that user, the processor may determine or predict grip characteristics and/or facial proximity using, for example, sensor information or information obtained during the optimization process (e.g., blocks 218, 220), as will be described later. The processor may store quantified or qualified descriptors of the determined or predicted grip characteristics and/or facial proximity in a table, which relates the user ID to the stored descriptors. For example, the processor may store a limited number of previously determined or predicted grip characteristic and facial proximity descriptors for a particular user ID. Alternatively, for example, the processor may store a single determined grip characteristic and/or facial proximity descriptor for each user ID, which may represent the most recently determined or predicted descriptor or the descriptor that is determined or predicted most frequently for the user. Once the historical information has been stored for a particular user ID, the processing system may retrieve the historical information in order to make a prediction of the grip characteristics and/or facial proximity when the user is later recognized (e.g., in block 210). Regardless of the manner in which the grip characteristics and/or facial proximity are determined or predicted, the quantified or qualified descriptors of grip characteristic and/or facial proximity may be used as a fourth type of tuning selection input.

In block 214, some or all of the previously received or determined tuning selection inputs are used to select one or more component values for an impedance matching circuit (e.g., matching circuit 106, FIG. 1) and/or an antenna tuning circuit (e.g., tuning circuit 107, FIG. 1). According to an embodiment, the component value(s) are selected from a set of pre-defined component values. For example, the component value(s) may be selected from a lookup table that is stored in the wireless device (e.g., in data storage 110, FIG. 1). Each entry of the lookup table includes a set of one or more component values for one or more impedance matching components of a matching circuit (e.g., matching circuit 106, FIG. 1) and/or tunable components of an antenna tuning circuit (e.g., tuning circuit 107, FIG. 1). For purposes of explanation and example, an embodiment of a matching circuit will now be described in conjunction with FIG. 3, and an example of a component value lookup table will be described in conjunction with FIG. 4.

Figure 3:
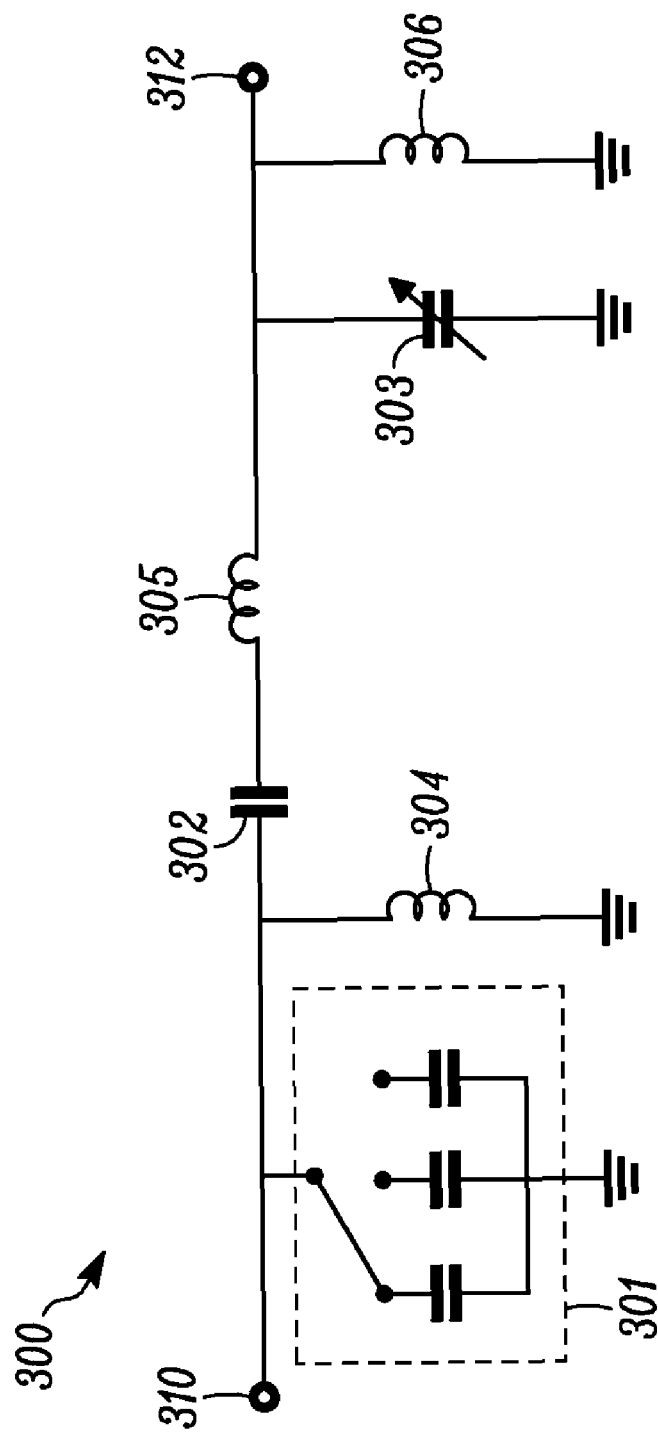
FIG. 3 illustrates an example of an impedance matching circuit, in accordance with an example embodiment.

FIG. 3 illustrates an example of a matching circuit 300, in accordance with an example embodiment. Matching circuit 300 may be coupled between a transceiver (e.g., transceiver 104, FIG. 1) or a transmitter and an antenna (e.g., antenna 108, FIG. 1) in a wireless communication device. According to the illustrated embodiment, matching circuit 300 includes a plurality of capacitors 301, 302, 303, and a plurality of inductors 304, 305, 306, interconnected so that they may produce an impedance between input terminal 310 and output terminal 312. Capacitors 301, 303 and inductors 304, 306 are arranged in parallel to ground, and capacitor 302 and inductor 305 are arranged in series between terminals 310 and 312. The illustrated arrangement of capacitors 301-303 and inductors 304-306 are provided for purposes of illustration only, and it is to be understood that a variety of different circuit configurations may be used to provide an impedance matching circuit. Accordingly, in other embodiments, an impedance matching circuit may have more or fewer (including zero) variable capacitors and/or inductors, and may also or alternatively include one or more transformers, switchable elements (e.g., transistors), and/or resistive and high dielectric components (e.g., resistors, pucks). In addition, the arrangement of components may be different from that shown in FIG. 3.

Capacitors 301-303 and inductors 304-306 are reactive components, and their respective component values each contribute to the overall impedance of matching circuit 300. According to an embodiment, one or more (including all) of capacitors 301-303 and/or inductors 304-306 may be variable components, whose component values may be varied electrically or mechanically. For example, capacitor 303 is illustrated as a varactor, which has a capacitance that may be varied based on the voltage applied across its terminals. Any one or more of capacitors 301-303 may be a varactor, in various embodiments. As another example, capacitor 301 is illustrated as a switched capacitor network that includes multiple capacitors (e.g., arranged in parallel, although the capacitors may be arranged in series or both in parallel and in series) and one or more switches. An example of three capacitors arranged in parallel and selectively connectable between terminal 310 and ground through a single pole, three throw (SP3T) switch is shown for example purposes only, and various types of capacitor networks and/or switching arrangements may be used. In an embodiment that includes a switched capacitor network, the states of the switches (e.g., open or closed) may be controlled to cause each of the multiple capacitors to contribute (or not contribute) to the overall capacitance of the switched capacitor network. Any one or more of capacitors 301-303 may be a switched capacitor network, in various embodiments. Similarly, one or more of inductors 304-306 may include a variable inductor, which has an inductance that may be varied based on the voltage applied across its terminals or the current provided through its coil(s). Alternatively, one or more of inductors 304-306 may include a switched inductor network that includes multiple inductors (e.g., arranged in parallel, series or both) and one or more switches. In such an embodiment, the states of the switches may be controlled to cause each of the multiple inductors to contribute (or not contribute) to the equivalent inductance of the switched inductor network. In yet another embodiment, one or more of inductors 304-306 may include a mechanically variable inductor (e.g., an inductor that includes a sliding contact mechanism that enables turns of the inductor coil to be included or omitted).

As discussed previously, embodiments include determining (e.g., selecting) component values for one or more impedance matching components of a matching circuit (e.g., matching circuit 106, FIG. 1 or matching circuit 300, FIG. 3) and/or tunable components of an antenna tuning circuit (e.g., tuning circuit 107, FIG. 1). Various combinations of component values may be pre-determined and included within entries of a component value lookup table that is accessible to the wireless device. For purposes of explanation, an example of a component value lookup table that includes various combinations of component values for capacitors 301-303 will now be described. It is to be understood that a component value lookup table may include component values for more, fewer or different components (e.g., for more or fewer capacitors and/or for one or more inductors, transformers, resistive components or other components), and/or for components associated with an antenna tuning circuit (e.g., tuning circuit 107, FIG. 1).

FIG. 4 illustrates an example of a component value lookup table 400, in accordance with an example embodiment. Lookup table 400 includes a plurality of entries 401, 402, 403, 404, 405, 406, 407, 408, 409, 410, 411, 412 and each entry 401-412 has several fields 421, 422, 423, 424, 425, 426, 427, 428, 429, arranged in columns in table 400. According to an embodiment, fields 421-429 include an entry number (NO.) field 421, a call type field 422, a channel (CHAN) field 423, a speakerphone (SPKRPH) field 424, a Bluetooth (BT) field 425, a grip field 426, a proximity (PROX) field 427, a signal-to-noise ratio (SNR) field 428, and a component value field 429.

As mentioned previously, lookup table 400 may be a relational table, and fields 422-428 represent various selection variables, which essentially may be used as keys for selecting one or more of entries 401-412. According to an embodiment, each of these "selection variable fields" 422-428 may correspond to one or more tuning selection inputs (e.g., tuning selection inputs received or determined in blocks 204, 206, 210, 212 of FIG. 2). For example, for a particular entry, and as shown in FIG. 4:

Call type field 422 may include a value that indicates whether a call corresponds to a voice communication session, a data communication session, or another type of communication session (e.g., as determined in block 204, FIG. 2). For example, a "V" may designate a voice communication session, and a "D" may designate a data communication session, even though the indication may be differently encoded, in other embodiments. Although only voice ("V") and data ("D") call types are represented in FIG. 4, it is to be understood that other call types also or alternatively may be represented (e.g., WiFi, WiMax, video or other types).

Channel field 423 may include a value that identifies a channel (or frequency or frequency band) allocated for the call (e.g., as determined in block 204, FIG. 2). The channel (or frequency or frequency band) may be indicated as a channel number, even though the indication may be differently encoded, in other embodiments.

Speakerphone field 424 may include a value that indicates the speakerphone activation status (i.e., whether the speakerphone is in an activated state or a deactivated state, as determined in block 204, FIG. 2). For example, a "1" may indicate that the speakerphone is in an activated state, and a "0" may indicate that the speakerphone is in a deactivated state, even though the indication may be differently encoded, in other embodiments. In an alternate embodiment, lookup table 400 may include a speaker activation field, in addition to or instead of speakerphone field 424, since activation of the speakerphone or the speaker may be mutually exclusive events.

Bluetooth field 425 may include a value that indicates whether communication using a Bluetooth protocol is in an enabled state or a disabled state (e.g., as determined in block 204, FIG. 2). For example, a "1" may indicate that communications using a Bluetooth protocol is enabled, and a "0" may indicate that communications using a Bluetooth protocol is disabled, even though the indication may be differently encoded, in other embodiments.

Grip field 426 may include a value that indicates (quantitatively or qualitatively) the tightness and/or housing coverage of a user's grip (e.g., as predicted or determined in block 212, FIG. 2). For example, a relatively low number may indicate a relatively loose grip and/or minimal housing coverage, and a relatively high number may indicate a relatively tight grip and/or more extensive housing coverage, even though the indication may be differently encoded, in other embodiments.

Proximity field 427 may include a value that indicates (quantitatively or qualitatively) the proximity of the wireless device to the user's body or other objects (e.g., as predicted or determined in block 212, FIG. 2). For example, a relatively low number may indicate that the device is not proximate to another object, and a relatively high number may indicate that the device is proximate to and/or contacting another object, even though the indication may be differently encoded, in other embodiments.

SNR field 428 may include a value that indicates an SNR level (e.g., as determined in block 212, FIG. 2). For example, an "L" may indicate that the SNR has a relatively low level (e.g., below a threshold), and an "H" may indicate that the SNR has a relatively high level (e.g., above a threshold), even though the indication may be differently encoded, in other embodiments.

Component value field 429 may include one or more component values for one or more components of a matching circuit (e.g., matching circuit 106, 300, FIGS. 1, 3) and/or an antenna tuning circuit (e.g., tuning circuit 107, FIG. 1). For example, in the illustrated embodiment, component value field 429 includes values for three capacitors, C1, C2, and C3, which may represent capacitors of a matching circuit and/or a tuning circuit. As a more particular example, C1 may correspond to capacitor 301 (FIG. 3), C2 may correspond to capacitor 302 (FIG. 3), and C3 may correspond to capacitor 303 (FIG. 3). The capacitor values within component value field 429 are expressed in terms of capacitance (i.e., pico Farads (pF)). In alternate embodiments, capacitor values may be expressed in terms of voltages (e.g., voltages to be applied across the terminals of a varactor), switch states (e.g., states of switches in a switched capacitor network), or some other variable unit that may be analyzed and/or applied to affect a capacitance value of a variable capacitor. Similarly, in embodiments in which a matching circuit or a tuning circuit includes variable inductors (or other variable components), component values included within a lookup table may be expressed in terms of inductances, voltages, currents, switch states, or other variable terms. It is to be understood that the number of components and type of components for which values are included in lookup table 400 (i.e., three, in the given example) is provided for example purposes only. In addition, the number of entries 401-412 and the component values also are for example purposes only, and a lookup table may include more or fewer entries and different component values than those illustrated in FIG. 4. Finally, the number and type of selection variables represented in selection variable fields 422-428 may be different from those provided in the example of FIG. 4.

According to an embodiment, the component values within the entries 401-412 are pre-determined (e.g., by system designers) and the lookup table 400 is stored within the wireless device during the manufacturing process. The tuning state of the matching circuit and/or the tuning circuit may affect both the transmit performance and the receive performance. Accordingly, component values to be included within lookup table 400 are pre-determined, in an embodiment, so that both transmit and receive performance should be within acceptable tolerances for any selected entry 401-412. This embodiment may be referred to as a "forbidden states" embodiment, in that tuning states that would unacceptably degrade receive performance are excluded from the lookup table 400. Accordingly, receive performance is preserved even though the tuning optimization process (e.g., blocks 218, 220) may primarily use feedback associated with the transmit path (e.g., VSWR measurements), as will be discussed in more detail later. In another embodiment, information regarding the receive performance may be obtained using direct, receive sub-band feedback. For example, integrated RSSI (Receive Signal Strength Indication) measurements may be provided by the receiver portion of the transceiver (e.g., transceiver 104, FIG. 1) to the processing system (e.g., processing system 102, FIG. 1), and these RSSI measurements may be analyzed to verify adequate return loss at the current receive frequency. According to another embodiment, feedback from a remote system component (e.g., a base station) may be provided to the device, and such feedback also may be used to evaluate receive performance. Various modes of direct, receiver channel feedback may be used, in various embodiments, to determine receive performance and to ensure that receive performance is not unacceptably degraded. Other embodiments for preserving receive performance will be discussed later.

Referring again to block 214 of FIG. 2, and as mentioned above prior to the description of FIGS. 3 and 4, the processing system uses some or all of the previously received or determined tuning selection inputs to select one or more component values for an impedance matching circuit (e.g., matching circuit 106, FIG. 1 or 300, FIG. 3) and/or an antenna tuning circuit (e.g., tuning circuit 107, FIG. 1). In an embodiment in which pre-defined component values are selected using a lookup table (e.g., lookup table 400, FIG. 4), the selection process may include the processing system using one or more of the tuning selection inputs as one or more keys for selecting one or more of the lookup table entries, where the keys are matched with values in the selection variable fields 422-428. The processing system may correlate tuning selection inputs with values within fields 422-428 in a sequential manner (e.g., until a desired number of candidate entries is identified or a single number of candidate entries is identified), or the processing system may correlate multiple tuning selection inputs at once with the values within fields 422-428.

According to an embodiment, prior to performing the correlation process, the processing system may determine a subset of entries with which the processing system will perform the correlation. The subset of entries may include, for example, entries that have been previously selected for a user associated with a particular user ID (e.g., as determined in block 210). Information regarding previously-selected entries may be included in a historic selection table (e.g., table 500, FIG. 5), which is accessible to or stored in the wireless device (e.g., in data storage 110, FIG. 1). Keys to accessing the information may include the user ID (e.g., as determined in block 210) and/or the current call type (e.g., as determined in block 204), according to various embodiments. Storage of such information will be described in more detail later, in conjunction with the description of block 222. In an alternate embodiment, the processing system may not identify a user ID, and/or historic selection information may not be stored or accessed during the component value selection process.

Either way, component values may be determined by selecting one or more entries from the full lookup table or from a subset of entries of the lookup table. For example, assume that the processing system sequentially correlates the following tuning selection inputs: 1) call type; and 2) speakerphone state. The processing system may first correlate the call type tuning selection input (e.g., as determined in block 204, FIG. 2) with the values within call type field 422. When the call type is a voice communication session, this would result in the identification of entries 401-404 and 409-412 as candidate entries. The processing system may then correlate the speakerphone state tuning selection input (e.g., as determined in block 204, FIG. 2) with the values within speakerphone field 424. When the speakerphone is enabled, this would result in the identification of entries 401, 403, 411, and 412 as a narrowed set of candidate entries. Accordingly, the selection process may result in the selection of multiple candidate entries. As will be discussed in more detail below, the processing system may cause the component values (from component value field 429) for particular components of the matching circuit (e.g., matching circuit 300, FIG. 3) and/or antenna tuning circuit (e.g., tuning circuit 107, FIG. 1) to be set to the values of one of the multiple candidate entries.

Alternatively, the processing system may correlate as many tuning selection inputs as are necessary in order to identify a single entry, during block 214. For example, having identified entries 401, 403, 411, and 412 from previous correlations, the processing system may then correlate the channel tuning selection input (e.g., as determined in block 204, FIG. 2) with the values within channel field 423. When the assigned channel is channel "2", for example, this would result in the identification of entry 403 as being the only remaining candidate entry. Thus, the selection process may result in the selection of a single entry.

After selecting a set of component values and controlling the matching circuit (e.g., matching circuit 106, FIG. 1) or the antenna tuning circuit (e.g., tuning circuit 107, FIG. 1) to produce those component values, an optimization process (e.g., blocks 218, 220, discussed later) may be performed. Briefly, during the optimization process, the processing system may cause the component values to be set to different values from those associated with a selected entry of the lookup table (e.g., the values of a different one of the multiple candidate entries or other values). According to an embodiment, the component values within the lookup table (e.g., lookup table 400) may be used to establish a starting point for setting component values of a matching circuit (e.g., matching circuit 106, FIG. 1) and/or an antenna tuning circuit (e.g., tuning circuit 107, FIG. 1). Dynamic tuning may thereafter be performed using one or more forms of feedback, in order dynamically to adjust the impedance matching provided by the matching circuit (e.g., matching circuit 106) and/or the antenna tuning provided by the tuning circuit (e.g., tuning circuit 107) (e.g., to optimize the impedance matching and/or antenna tuning).

Although the above described example uses call type, speakerphone state, and channel as tuning selection inputs that are correlated with a component value lookup table, it is to be understood that the above-given example is for explanation purposes only. The processing system alternatively could correlate one or more additional or different tuning selection inputs (e.g., Bluetooth status, grip type, proximity, or SNR) with a component value lookup table, including other types of tuning selection inputs that may not have been discussed herein.

Component values may be considered to have been "determined" or "selected", according to an embodiment, once a particular entry within the lookup table has been selected. When the selection process has resulted in the selection of a single entry, then the component values are determined to be the values within the component value field 429 for that entry (e.g., the values or 4.7 pF, 5.4 pF, and 3.3 pF in field 429 of entry 403). When the selection process has resulted in the selection of multiple candidate entries, then the processing system may identify one of the multiple candidate entries (e.g., the first sequential entry in the set of candidates, arbitrarily, or using some other criteria), and the component values are determined to be the values within the component value field 429 for that entry.

In block 216, once a set of component values has been determined, the processing system causes the component values to be set or established within the matching circuit and/or the antenna tuning circuit. For example, the processing system may send control signals (e.g., control signals 150, 163, FIG. 1) to the matching circuit and/or the tuning circuit, which cause the values of the components to be established.

According to an embodiment, an optimization process may then be performed in order to more accurately tune the matching circuit to match the impedance of the antenna and/or to tune the tuning circuit to change the frequency characteristics of the antenna. A decision may be made, in block 218, whether the matching and/or tuning is considered to be "optimized." This may include, for example, evaluating VSWR measurements (e.g., provided from VSWR detector 120, FIG. 1) to determine whether the level of return loss is above or below a threshold, or meets some other criteria. Alternatively, the matching and/or tuning circuit may be considered to be optimized when a set of component values has been selected that results in a "best" return loss for all evaluated sets of component values. Determining whether the matching and/or tuning circuit is considered to be optimized may include evaluating performance related measurements other than or in addition to return loss, in various embodiments.

When it is determined that the matching and/or tuning circuit is not optimized, then the tuning of the matching and/or tuning circuit may be adjusted, in block 220. According to an embodiment, tuning adjustment includes iteratively selecting a different set of component values (e.g., selecting a different entry of table 400, FIG. 4), setting the components of the matching and/or tuning circuit to the newly selected values, and re-evaluating the transmit performance. In an embodiment, the component value lookup table entries may be arranged so that adjacent entries include component values which, when established in the matching and/or tuning circuit, should cause the measured transmit return loss to follow along a known performance curve, rather than jumping abruptly to non-contiguous points of the performance curve. Accordingly, selection of adjacent entries may cause the transmit performance to change gradually from entry to entry, rather than abruptly. In such an embodiment, prior to a determination that the matching and/or tuning circuit is optimized, each iteration of the optimization process (i.e., each iteration of performing block 220) may include selecting an entry that is adjacent to (either above or below) a previously selected entry. When it is determined that the tuning of the matching and/or tuning circuit is becoming worse when selecting entries in one direction, the optimization process may switch to selecting entries in the opposite direction. In such a manner, the optimization process may enable the system to converge upon a "best" set of component values (i.e., a set of component values that results in a lowest return loss), as included in a "best" entry of the lookup table.

Alternatively, in an embodiment in which block 214 results in the identification of multiple candidate entries of the lookup table, selecting a different set of component values may include selecting a different one of the candidate entries. However different entries are selected, blocks 218 and 220 may be performed one or multiple times (e.g., until the matching and/or tuning circuit tuning is optimized, until the return loss falls below a particular threshold, or for a pre-determined number of iterations).

As discussed previously in conjunction with the description of FIG. 4, the component values included within lookup table 400 may be pre-determined, in an embodiment, so that both transmit and receive performance should be within acceptable tolerances (e.g., sufficiently low return losses) for any selected entry 401-412. In such an embodiment, the optimization process may result in the selection of a tuning state that provides the "best" (e.g., lowest) transmit return loss, when compared with other tuning states. This embodiment was referred to as the "forbidden states" embodiment. According to another embodiment, the receive performance may be preserved by exploiting known behavior of the antenna (e.g., knowledge of the transmit and receive return loss performance curve) to bias the optimization process in a manner that is likely to result in adequate transmit and receive performance, although not necessarily optimal transmit performance. According to an embodiment, this may include attempting to establish a tuning state that results in an optimal region of the return loss curve (e.g., a region that includes a minima of the return loss curve and portions of the return loss curve within 2 decibels (or some other value) of the minima) being positioned between the transmit frequency and the receive frequency (e.g., a frequency that is higher or lower than the transmit frequency by some frequency difference (e.g., 45 MHz or some other difference). This may be achieved, for example, by setting a fixed target for transmit optimization (e.g., 5 decibels of return loss). Once the target has been reached, a component that is known to shift frequency right or left may be adjusted slightly up and down while continuing to monitor the return loss. In this way, the slope of the return loss curve in the transmit region may be sensed, allowing the tuning system to detect whether the minima of the return loss curve is in the direction of the receive frequency or away from it. In some embodiments, the tuning system will continue to optimize the transmit frequency if the minima is in the direction of the receive frequency and may attempt to retune the impedance matching circuit or antenna tuning circuit if the direction of the return loss minima, relative to the transmit frequency, is away from the receive frequency (e.g., by selecting a different component value that results in the minima of the return loss curve being positioned between the transmit frequency and the receive frequency). A priori knowledge of the return loss curve for various environmental conditions can be stored in a lookup table to help guide tuning decisions, using embodiments of methods that are similar to those described earlier. According to yet another embodiment, the transmit tuning optimization could initially be driven to a best return loss, and then a fixed offset adjustment (e.g., based on a priori knowledge of the antenna response curves) could be applied to the tuning component that is known to shift frequency in a manner that will balance the responses between the transmit and receive frequencies. For example, this may include determining an initial component value from a set of pre-defined component values, where the initial component value corresponds to a minima of the return loss curve being positioned at the transmit frequency. This corresponds to optimizing tuning to the transmit frequency. An offset adjustment may then be applied to the initial component value that causes the optimal region (e.g., including the minima) of the return loss curve to shift to a position between the transmit frequency and the receive frequency. According to a further embodiment, the offset adjustment may result in the optimal region of the return loss curve being shifted to a position that is about halfway between the transmit frequency and the receive frequency. In either case, receive channel feedback may be used to verify and/or assist in the optimization of receive performance. It may be noted that devices that are operating using a GSM protocol do not transmit and receive signals simultaneously. This allows for the possibility of tuning for the transmit and receive frequencies separately, according to an embodiment.

Once a determination is made that the tuning is optimized (in block 218), historic information regarding the tuning may be stored, in block 222, according to an embodiment. More particularly, historic tuning information may be stored in conjunction with the user ID of the user who may have been previously identified (in block 210) as currently using the wireless device. According to an embodiment, storing historic information may include storing an entry number within the component value lookup table (e.g., the number within entry number field 421, FIG. 4) that was ultimately selected during the optimization process. Alternatively, in an embodiment in which optimization is not performed, storing historic information may include storing one or more of the entry number(s) selected in block 214, in which case block 222 may be performed earlier. Either way, historic selection information is stored within the wireless device in a historic selection table (e.g., in data storage 110, FIG. 1), according to an embodiment. In addition, the type of call, the time in a particular tuning state, and other information also may be stored in conjunction with the historic selection information. As discussed previously, the selection history for a particular user may enable the processing system to identify (during block 214, FIG. 2) a subset of component value lookup table entries that the processing system will evaluate during the entry selection process.

FIG. 5 illustrates an example of a historic selection table 500, in accordance with an example embodiment. Historic selection table 500 includes a plurality of entries 501, 502, 503, 504, and each entry 501-504 includes a user ID field 511, a call type field 512, a selection history field 513, and a time in tuning state field 514. The user ID field 511 includes a value that indicates the identity of a particular user, which identity may be determined, for example, through execution of a speaker recognition algorithm (e.g., in block 210, FIG. 2). Each time a new speaker is recognized by the system (e.g., a speaker having previously unrecognized speech characteristics), a unique user ID may be assigned to the new speaker, and one or more table entries may be generated within table 500, according to an embodiment. Accordingly, for example, entries 501 and 502 correspond to a user having a user ID of 0001, entry 503 corresponds to a user having a user ID of 0002, and entry 504 corresponds to a user having a user ID of 0027. Numeric user ID values are given for example purposes only, and other ways of encoding user IDs may be used, in other embodiments.

Call type field 512 may include a designator of a type of call that the device was engaged in for the stored selection history data. For example, entry 501 for user ID 0001 corresponds to selection history data that was stored in conjunction with voice "V" communications that were conducted by the device for the user associated with user 0001, and entry 502 for the same user ID 0001 corresponds to selection history data that was stored in conjunction with data "D" communications that were conducted by the device for the user associated with user 0001.

Selection history field 513 may include or indicate the identity of one or more previously-selected lookup table entries for a particular user ID and call type, according to an embodiment. For example, for entry 501 associated with user ID 0001, selection history field 513 indicates that lookup table entries 15, 17, 37, and 34 have been previously selected for that user during voice communications. In addition, for entry 502 associated with user ID 0001, selection history field 513 indicates that lookup table entries 21 and 24 have been previously selected for that user during data communications. The lookup table entries associated with a particular user ID may be arranged, within selection history field 513, in an order that indicates the desirability that a particular lookup table entry is first selected. For example, the lookup table entries may be arranged in order of the cumulative duration of time that a particular entry has been used as the basis for setting component values (e.g., the entry whose component values have been established for the longest cumulative time is first), as is shown in FIG. 5. Alternatively, the lookup table entries may be arranged in reverse chronological order (e.g., last in, first out), in order of the number of times a particular entry has been selected for the user (e.g., the entry that has been selected most frequently may be first), or in some other order. Although selection history field 513 is shown to include lookup table entry numbers, selection history field 513 may include actual component values, in an alternate embodiment (e.g., component values stored within particular entries of the lookup table).

Time in tuning state field 514 may include indications of how much time the component settings for a particular lookup table entry were in effect. For example, in entry 501, the time in tuning state field 514 indicates that component settings associated with lookup table entry 15 (from selection history field 513) were in effect for 1 hour, 15 minutes, and 27 seconds, and that component settings associated with lookup table entry 17 were in effect for 47 minutes and 15 seconds. The amount of indicated time in the time in tuning state field 514 may be a cumulative value, according to an embodiment, which indicates a cumulative time over a certain time period (e.g., 24 hours, 1 week, or some other time period) or a cumulative time during one or more previous calls, for example.

Referring again to FIG. 2, a determination may be made, in block 224, whether the call has been terminated. If not, the method proceeds once again to block 204 and iterates as shown. By re-performing blocks 204-212, changes in the various tuning selection inputs may be indicated, and different component values for tuning the matching circuit may be determined in light of those changes. In an alternate embodiment, the processing system may be alerted to changes in tuning selection inputs through a messaging or interrupt process, thus eliminating the need for re-performing some or all of blocks 204-212. When a determination is made, in block 224, that the call has been terminated, the method ends.

The sequence of process blocks illustrated in FIG. 2 represent just one example of an order in which the process blocks may be performed, and the depicted sequence is not intended to limit the scope of the inventive matter only to the depicted order. Instead, it is to be understood that, in alternate embodiments, some or all of the process blocks illustrated in FIG. 2 may be performed in different orders, may be performed in parallel, may be combined together, may be expanded into multiple sub-processes, and/or may include one or more intermediate processes that are not illustrated. In addition, some of the process blocks may be optionally performed, in various embodiments.

Thus, various embodiments of adaptive antenna tuning systems and methods have been described. While the principles of the inventive subject matter have been described above in connection with specific systems, apparatus, and methods, it is to be clearly understood that this description is made only by way of example and not as a limitation on the scope of the inventive subject matter. Further, the phraseology or terminology employed herein is for the purpose of description and not of limitation.

An embodiment of a method for tuning an antenna of a wireless communication device that includes the antenna and at least one tunable component that has an affect on the tuning of the antenna. The method comprises the steps of determining one or more tuning selection inputs in conjunction with a wireless communication session that is supported by the wireless communication device, determining, based on the tuning selection inputs, a component value for a component of the at least one tunable component, wherein the component value is determined from a set of pre-defined component values, and setting the component to have the component value. According to a further embodiment, determining the component value comprises determining a component value for an impedance matching component of an impedance matching circuit. According to another further embodiment, determining the component value comprises determining a component value for a tunable component of an antenna tuning circuit.

Another embodiment of a method for tuning an antenna of a wireless communication device comprises the steps of predicting characteristics of a grip with which a user is holding the wireless communication device, determining, based on the characteristics of the grip, a component value for a component of the at least one tunable component, wherein the component value is determined from a set of pre-defined component values, and controlling the component to have the component value.

An embodiment of an antenna tuning system of a wireless communication device comprises an antenna, a circuit comprising at least one tunable component, and a processing system. The processing system is adapted to determine tuning selection inputs in conjunction with a communication session being supported by the wireless communication device, determine, based on the tuning selection inputs, at least one component value for the at least one tunable component, wherein the at least one component value is determined from a set of pre-defined component values, and control the at least one tunable component to have the at least one component value. According to a further embodiment, the circuit comprises an impedance matching circuit that includes at least one reactive component, which has a value that may be varied under the command or control of the processing system. According to another further embodiment, the circuit comprises an antenna tuning circuit that includes at least one variable component, which has a value that may be varied under the command or control of the processing system.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the inventive subject matter in any way. Rather, the foregoing detailed description will provide those skilled in the art with a convenient road map for implementing an exemplary embodiment of the inventive subject matter, it being understood that various changes may be made in the function and arrangement of elements described in an exemplary embodiment without departing from the scope of the inventive subject matter as set forth in the appended claims and their legal equivalents.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims and their legal equivalents.

What is claimed is:

1. A method for tuning an antenna of a wireless communication device that includes the antenna and at least one tunable component that has an affect on the tuning of the antenna, the method comprising the steps of:

determining one or more tuning selection inputs in conjunction with a wireless communication session that is supported by the wireless communication device, wherein the tuning selection inputs include one or more types of information selected from a group of information types that includes a call type indicating whether the wireless communication session is a voice communication session, a data communication session or another type of communication session, a speakerphone activation indicator, a speaker activation indicator, a Bluetooth activation indicator, a user identity, information characterizing a grip with which a user is holding the wireless communication device, information characterizing a physical proximity of the wireless communication device to the body of the user, a sensor input, and a signal-to-noise ratio (SNR) measurement;

determining, based on the tuning selection inputs, a component value for a component of the at least one tunable component, wherein the component value is determined from a set of pre-defined component values; and setting the component to have the component value.

2. The method of claim 1, wherein each value of the set of pre-defined component values is included in an entry of a lookup table stored in the wireless communication device.

3. The method of claim 1, wherein:

determining the tuning selection inputs comprises determining whether the communication session is a voice communication session, a data communication session or another type of communication session; and when the communication session is the voice communication session, determining the component value comprises selecting a first component value, and when the communication session is the data communication session, determining the component value comprises selecting a second component value, wherein the second component value is different from the first component value.

4. The method of claim 1, wherein:
- determining the tuning selection inputs comprises determining whether a speakerphone of the wireless communication device is in an activated state or a deactivated state; and
- when the speakerphone is in a deactivated state, determining the component value comprises selecting a first component value, and
- when the speakerphone is in an activated state, determining the component value comprises selecting a second component value, wherein the second component value is different from the first component value.

5. The method of claim 1, wherein:
- determining the tuning selection inputs comprises determining whether Bluetooth communication is in an enabled state or a disabled state; and
- when the Bluetooth communication is in a disabled state, determining the component value comprises selecting a first component value, and
- when the Bluetooth communication is in an enabled state, determining the component value comprises selecting a second component value, wherein the second component value is different from the first component value.

6. The method of claim 1, wherein determining the tuning selection inputs comprises predicting a physical proximity of the wireless communication device to a face of a user of the wireless communication device.

7. The method of claim 1, wherein:
- determining the tuning selection inputs comprises receiving digitized speech from a user interface of the wireless communication device, and evaluating the digitized speech using a speaker recognition algorithm to determine a user identity; and
- determining the component value comprises selecting the component value from one or more historic component values associated with the user identity.

8. A method for tuning an antenna of a wireless communication device that includes the antenna and at least one tunable component that has an affect on the tuning of the antenna, the method comprising the steps of:
- determining one or more tuning selection inputs in conjunction with a wireless communication session that is supported by the wireless communication device;
- determining, based on the tuning selection inputs, a component value for a component of the at least one tunable component, wherein the component value is determined from a set of pre-defined component values that are stored in the device in a lookup table;
- setting the component to have the component value;
- determining whether the setting step resulted in an optimized tuning state; and
- when the setting step did not result in the optimized tuning state, determining a different component value for the at least one tunable component from the set of pre-defined component values, and setting the at least one tunable component to have the different component value.

9. The method of claim 8, wherein each value of the set of pre-defined component values is pre-determined to result in acceptable receive performance.

10. A method for tuning an antenna of a wireless communication device that includes the antenna and at least one tunable component that has an affect on the tuning of the antenna, the method comprising the steps of:
- determining one or more tuning selection inputs in conjunction with a wireless communication session that is supported by the wireless communication device;
- determining, based on the tuning selection inputs, a component value for a component of the at least one tunable component, wherein the component value is determined from a set of pre-defined component values, and the component value is determined to be a component value that results in an optimal region of a return loss curve being positioned between a transmit frequency and a receive frequency; and
- setting the component to have the component value.

11. The method of claim 10, wherein determining the component value comprises:
- determining an initial component value from the set of pre-defined component values, wherein the initial component value corresponds to an optimal region of a return loss curve being positioned at the transmit frequency; and
- applying an offset adjustment to the initial component value that causes the optimal region of the return loss curve to shift to a position between the transmit frequency and a receive frequency.

12. The method of claim 11, wherein applying the offset adjustment comprises:
- applying the offset adjustment so that the optimal region of the return loss curve is shifted to a position that is about halfway between the transmit frequency and the receive frequency.

13. The method of claim 10, wherein determining the component value comprises:
- determining an initial component value from the set of pre-defined component values, wherein the initial component value corresponds to a target transmit return loss;
- determining whether the initial component value results in an optimal region of a return loss curve being positioned between the transmit frequency and the receive frequency; and
- when the optimal region is not between the transmit frequency and the receive frequency determining a different component value that results in the optimal region of the return loss curve being between the transmit frequency and the receive frequency.

14. A method for tuning an antenna of a wireless communication device that includes the antenna and at least one tunable component that has an affect on the tuning of the antenna, the method comprising the steps of:
- predicting characteristics of a grip with which a user is holding the wireless communication device;
- determining, based on the characteristics of the grip, a component value for a component of the at least one tunable component, wherein the component value is determined from a set of pre-defined component values; and
- controlling the component to have the component value.

15. The method of claim 14, wherein determining the component value comprises determining a component value for an impedance matching component of an impedance matching circuit.

16. The method of claim 14, wherein determining the component value comprises determining a component value for a tunable component of an antenna tuning circuit.

17. The method of claim 14, wherein predicting the characteristics of the grip comprises:
- determining a user identity for a user of the wireless communication device; and
- predicting the characteristics of the grip based on historical grip characterization information associated with the user identity.

18. The method of claim 14, further comprising:
receiving sensor information from one or more sensors; and
wherein predicting the characteristics of the grip comprises predicting the characteristics of the grip based on the sensor information.

19. An antenna tuning system of a wireless communication device, the antenna tuning system comprising:
an antenna;
a circuit comprising at least one tunable component; and
a processing system adapted to
determine tuning selection inputs in conjunction with a communication session being supported by the wireless communication device, wherein the tuning selection inputs include one or more types of information selected from a group of information types that includes a call type indicating whether the wireless communication session is a voice communication session, a data communication session or another type of communication session, a speakerphone activation indicator, a speaker activation indicator, a Bluetooth activation indicator, a user identity, information characterizing a grip with which a user is holding the wireless communication device, information characterizing a physical proximity of the wireless communication device to the body of the user, a sensor input, and a signal-to-noise ratio (SNR) measurement
determine, based on the tuning selection inputs, at least one component value for the at least one tunable component, wherein the at least one component value is determined from a set of pre-defined component values, and
control the at least one tunable component to have the at least one component value.

20. The antenna tuning system of claim 19, wherein the circuit comprises an impedance matching circuit that includes at least one reactive component, which has a value that may be varied under the command or control of the processing system.

21. The antenna tuning system of claim 19, wherein the circuit comprises an antenna tuning circuit that includes at least one variable component, which has a value that may be varied under the command or control of the processing system.

22. The antenna tuning system of claim 19, further comprising:
data storage adapted to store a lookup table that includes the set of pre-defined component values.

23. The antenna tuning system of claim 19, further comprising:
a user interface adapted to receive an analog speech signal and convert the analog speech signal to digitized speech, wherein
the processing system is further adapted to evaluate the digitized speech using a speaker recognition algorithm to determine a user identity, and to determine the at least one component value by selecting the at least one component value from one or more historic component values associated with the user identity.

* * * * *